(12) United States Patent
Hayashi et al.

(10) Patent No.: US 10,406,493 B2
(45) Date of Patent: Sep. 10, 2019

(54) DILUTED SOLUTION PRODUCTION METHOD AND DILUTED SOLUTION PRODUCTION APPARATUS

(71) Applicant: ORGANO CORPORATION, Tokyo (JP)

(72) Inventors: Yoshifumi Hayashi, Tokyo (JP); Yukinari Yamashita, Tokyo (JP); Koji Yamanaka, Tokyo (JP); Daisaku Yano, Tokyo (JP)

(73) Assignee: ORGANO CORPORATION, Tokyo (JP)

( * ) Notice: Subject to any disclaimer, the term of this patent is extended or adjusted under 35 U.S.C. 154(b) by 31 days.

(21) Appl. No.: 15/509,047

(22) PCT Filed: Aug. 4, 2015

(86) PCT No.: PCT/JP2015/072108
§ 371 (c)(1),
(2) Date: Mar. 6, 2017

(87) PCT Pub. No.: WO2016/042933
PCT Pub. Date: Mar. 24, 2016

(65) Prior Publication Data
US 2017/0259234 A1    Sep. 14, 2017

(30) Foreign Application Priority Data

Sep. 16, 2014 (JP) .................. 2014-187804

(51) Int. Cl.
*B01F 15/00* (2006.01)
*B01F 15/04* (2006.01)
(Continued)

(52) U.S. Cl.
CPC .......... *B01F 15/0408* (2013.01); *B01F 3/088* (2013.01); *B01F 3/0865* (2013.01);
(Continued)

(58) Field of Classification Search
CPC .... B01F 3/0865; B01F 15/0408; B01F 3/088; B01F 5/0403; B01F 15/00149;
(Continued)

(56) References Cited

U.S. PATENT DOCUMENTS 5,635,053 A * 6/1997 Aoki ................. B08B 3/08
134/109
6,764,212 B1 7/2004 Nitta et al.
(Continued)

FOREIGN PATENT DOCUMENTS

CN 102549516 7/2012
CN 102947768 2/2013
(Continued)

OTHER PUBLICATIONS

Singapore Written Opinion in respect to Singapore Application No. 11201701919, dated Dec. 12, 2017.
(Continued)

*Primary Examiner* — Anshu Bhatia
(74) *Attorney, Agent, or Firm* — Greenblum & Bernstein, P.L.C.

(57) ABSTRACT

A diluted solution production method of the present invention is a diluted solution production method of producing a diluted solution of a second liquid by adding the second liquid to a first liquid, the method including feeding the first liquid to a first pipe; and controlling pressure in a tank that stores the second liquid to add, through the second pipe that connects the tank to the first pipe, the second liquid to the first liquid in the first pipe. Adding the second liquid includes measuring a flow rate of the first liquid or the diluted solution that flows through the first pipe; measuring a component concentration of the diluted solution; and controlling the pressure in the tank, based on the measured values of the flow rate and the component concentration, so (Continued)

as to adjust the component concentration of the diluted solution to a specified value.

7 Claims, 6 Drawing Sheets

(51) Int. Cl.
| | | |
|---|---|---|
| *B01F 3/08* | (2006.01) | |
| *B01F 5/04* | (2006.01) | |
| *C11D 7/04* | (2006.01) | |
| *H01L 21/02* | (2006.01) | |
| *B01F 15/02* | (2006.01) | |
| *G05D 11/13* | (2006.01) | |
| *B01F 5/00* | (2006.01) | |

(52) U.S. Cl.
CPC ........ *B01F 5/0403* (2013.01); *B01F 15/0022* (2013.01); *B01F 15/00149* (2013.01); *B01F 15/00227* (2013.01); *B01F 15/00285* (2013.01); *B01F 15/00344* (2013.01); *B01F 15/00357* (2013.01); *B01F 15/0238* (2013.01); *B01F 15/0416* (2013.01); *C11D 7/04* (2013.01); *G05D 11/131* (2013.01); *H01L 21/02052* (2013.01); *B01F 2003/0896* (2013.01); *B01F 2005/0028* (2013.01); *B01F 2215/004* (2013.01); *B01F 2215/0096* (2013.01); *B01F 2215/0431* (2013.01)

(58) Field of Classification Search
CPC ............ B01F 15/0022; B01F 15/00227; B01F 15/00285; B01F 15/00344; B01F 15/00357; B01F 15/0238; B01F 15/0416; B01F 2003/0896; B01F 2005/0028; B01F 2215/004; B01F 2215/0096; B01F 2215/0431; C11D 7/04; G05D 11/131; H01L 21/02052

See application file for complete search history.

(56) References Cited

U.S. PATENT DOCUMENTS

| | | | |
|---|---|---|---|
| 7,195,024 B2 * | 3/2007 | Nitta | ............... B01F 5/0471 |
| | | | 134/100.1 |
| 7,878,703 B2 | 2/2011 | Roberts | |
| 8,202,485 B2 | 6/2012 | Walworth | |
| 2005/0045207 A1 | 3/2005 | Nitta et al. | |

FOREIGN PATENT DOCUMENTS

| | | |
|---|---|---|
| CN | 203012536 | 6/2013 |
| EP | 0729084 | 8/1996 |
| JP | 2000-208471 | 7/2000 |
| JP | 2000-265945 | 9/2000 |
| JP | 3343776 | 8/2002 |
| JP | 2003-311140 | 11/2003 |
| JP | 2005-161284 | 6/2005 |
| TW | 201433896 | 9/2014 |

OTHER PUBLICATIONS

International Search Report issued in Patent Application No. PCT/JP2015/072108, dated Nov. 2, 2015.

Official Communication in Taiwanese Application 10721027470 and search report, dated Oct. 2, 2018, and English translation thereof.

* cited by examiner

DILUTED SOLUTION PRODUCTION METHOD AND DILUTED SOLUTION PRODUCTION APPARATUS

TECHNICAL FIELD

The present invention relates to a diluted solution production method of producing a diluted solution and a diluted solution production apparatus therefor.

BACKGROUND ART

In a process for manufacturing semiconductor devices or liquid crystal displays, a diluted solution obtained by diluting a chemical liquid, such as aqueous ammonia, with ultrapure water is used as a cleaning liquid for cleaning silicon wafers or glass substrates for liquid crystal panels. As a method of producing the diluted solution, there is known a method of adding a minute amount of a chemical liquid to ultrapure water supplied to a point of use, and various proposals have been made therefor.

For example, Patent Literature 1 proposes a method of adding a chemical liquid in a chemical tank to a pipe that carries ultrapure water by using a chemical liquid supply pump. In this method, electric conductivity of ultrapure water to which the chemical liquid has been added (diluted solution of chemical liquid) is measured, and based on the measured value, the amount of the chemical liquid to be added is adjusted.

Patent Literature 2 proposes a method of adding a chemical liquid by using a plurality of small pipes equipped with valves and connected in parallel between a circulation pipe that circulates ultrapure water and a feeder of the chemical liquid. In this method, the pressure at the time of adding the chemical liquid to the circulation pipe is adjusted to a certain fixed value, and the amount of the chemical liquid supplied to the circulation pipe is controlled in accordance with the number of the valves that are opened.

Furthermore, Patent Literature 3 proposes a method of adding a chemical liquid by using a chemical supply pipe that connects a cleaning liquid supply pipe to a chemical liquid storage container. In this method, the amount of the chemical liquid added from the chemical supply pipe to the cleaning liquid supply pipe is controlled by adjusting the pressure of gas supplied to the chemical liquid storage container based only on the flow rate of the cleaning liquid in the cleaning liquid supply pipe.

CITATION LIST

Patent Literature

Patent Literature 1: JP 2000-208471 A
Patent Literature 2: JP 2003-311140 A
Patent Literature 3: JP 3343776 B

SUMMARY OF THE INVENTION

Technical Problem

However, the above methods of producing a diluted solution disclosed in Patent Literatures 1, 2, and 3 have the following problems, respectively.

In the method of producing a diluted solution disclosed in Patent Literature 1, when the chemical liquid in the diluted solution has uneven concentration due to the pulsation of the chemical liquid supply pump, or when a high dilution ratio is set, it is necessary to store the chemical liquid, which is preliminarily diluted to some extent, in a tank before adding the diluted chemical liquid to ultrapure water.

In the method of producing a diluted solution disclosed in Patent Literature 2, it is necessary to install a plurality of small pipes equipped with valves, which complicates the apparatus structure. Furthermore, since the concentration of a producible diluted solution is determined by the number of installed small pipes, it is difficult to accurately produce the diluted solution that will have a specified concentration.

In the method of producing a diluted solution disclosed in Patent Literature 3, the pressure in the chemical liquid storage container is adjusted based only on the flow rate of the cleaning liquid. Accordingly, when the chemical concentration in the chemical liquid storage container fluctuates due to vaporization, degradation, or the like, the concentration of the diluted solution to be obtained deviates from the target value.

Accordingly, the present invention has been made in view of the above described problems, and it is therefore an object of the present invention to provide a method of producing a diluted solution and an apparatus for producing the diluted solution with a simple apparatus structure, the method and apparatus allowing precise addition of a minute amount of a high concentration liquid to a diluent medium so as to provide the diluted solution that will have a specified concentration.

Solution to Problem

According to one aspect of the present invention, there is provided a diluted solution production method of producing a diluted solution of a second liquid by adding the second liquid to a first liquid, the method including the steps of: feeding first liquid to a first pipe; and controlling pressure in a tank that stores the second liquid so as to add, through a second pipe that connects the tank to the first pipe, the second liquid to the first liquid flowing through the first pipe, the step of adding the second liquid including the steps of: measuring a flow rate of the first liquid or the diluted solution that flows through the first pipe; measuring a component concentration of the diluted solution; and controlling the pressure in the tank, based on measured values of the flow rate and the component concentration, so as to adjust the component concentration of the diluted solution to a specified value.

According to another aspect of the present invention, there is provided a diluted solution production apparatus for producing a diluted solution of a second liquid by adding the second liquid to a first liquid, the apparatus including: a first pipe that supplies the first liquid; a tank that stores the second liquid; a second pipe that supplies the second liquid from the tank to the first pipe; a flowmeter that measures a flow rate of the first liquid or the diluted solution that flows through the first pipe; a meter that measures a component concentration of the diluted solution; and a controller that controls pressure in the tank, based on measured values of the flowmeter and the meter, so as to adjust the component concentration of the diluted solution to a specified value.

The invention relating to the above-described method and apparatus provides solutions to the problems relating to the methods of producing a diluted solution disclosed in each of Patent Literatures 1 to 3. More specifically, in the diluted solution production method and the diluted solution production apparatus of the present invention, the pressure in the tank that stores the second liquid is controlled so as to adjust a pressure gradient generated between the first pipe and the tank that is connected to the first pipe through the second pipe. As a result, the second liquid in the tank is added to the first liquid flowing through the first pipe. The second liquid is a chemical liquid to be diluted. The first liquid is a diluent medium, such as pure water. A liquid obtained by adding the chemical liquid to the diluent medium is a diluted solution of the chemical liquid. Such a method of adding the chemical liquid is different from the methods of producing a diluted solution disclosed in Patent Literatures 2 and 3 in the following points.

In the diluted solution production method and the diluted solution production apparatus of the present invention, the flow rate and the component concentration of the diluted solution that flows through the first pipe are measured. Based on these measured values, an in-tank pressure is adjusted so as to control the amount of the chemical liquid to be added from the tank. On the other hand, in the method of producing a diluted solution disclosed in each of Patent Literatures 2 and 3, the flow rate or the component concentration of the diluted solution that flows through the first pipe is measured, and based on the measured value, the amount of the chemical liquid to be added from the tank is controlled. The term "component concentration" as used herein refers to the concentration of a component that is derived from the chemical liquid. The component concentration in the diluted solution can directly be measured or can be indirectly measured by using an electric conductivity or other parameters.

In the case where the amount of the chemical liquid to be added from the tank is controlled based only on the measured value of the flow rate of the diluted solution, when, for example, the chemical concentration in the tank fluctuates due to vaporization, degradation, or the like, the obtained component concentration of the diluted solution may deviate from the target value. In the case where the amount of the chemical liquid to be added from the tank is controlled based only on the measured value of the component concentration of the diluted solution, when, for example, fluctuation in the flow rate of the diluted solution occurs, the component concentration of the diluted solution in an early stage of fluctuation in the flow rate may not be maintained at a specified value. This is because it takes a certain period of time for the meter to detect the component concentration. Therefore, in order to provide the diluted solution with a specified component concentration even when the flow rate of the diluted solution or the first liquid (diluent medium) fluctuates or even when the concentration of the second liquid (chemical liquid) in the tank fluctuates, it is necessary to control the pressure in the tank based on both the measured values of the flow rate and the component concentration of the diluted solution.

In the present invention, the flow rate and the component concentration of the diluted solution or the first liquid flowing through the first pipe are measured, and based on those measured values, the pressure in the tank is controlled so as to adjust the component concentration of the diluted solution to a specified value. Accordingly, as compared with the methods of producing a diluted solution disclosed in Patent Literatures 2 and 3, a diluted solution that has an accurate component concentration as specified can be obtained.

As described above, the diluted solution production apparatus of the present invention controls the pressure in the tank to adjust the pressure gradient between the tank and the first pipe, so that the supplied amount of the second liquid (chemical liquid) that passes through the second pipe is controlled. This flow control is achieved by applying the Hagen-Poiseuille law concerning head loss in the laminar flow in a circular pipe.

<Hagen-Poiseuille Law>

The flow rate Q [m$^3$/s] of a viscose liquid flowing through a circular pipe having a diameter D[m] and a length L[m] within a fixed period of time is obtained in the following equation:

$$Q = \pi \times D^4 \times \Delta P / (128 \times \mu \times L).$$

That is, "the flow rate Q[m$^3$/s] is proportional to the 4th power of the diameter D[m], proportional to a pressure gradient $\Delta P$[Pa] between both ends of the pipe, inversely proportional to the length L[m] of the pipe, and inversely proportional to a coefficient of viscosity $\mu$ [Pa·s]". This is called the Hagen-Poiseuille law.

More specifically, the diluted solution production apparatus of the present invention can control the supplied amount of the second liquid (chemical liquid) that passes through the second pipe by determining the type of the second liquid fed to the second pipe and then controlling only the in-tank pressure. Furthermore, when the diluted solution production apparatus of the present invention is manufactured and actually used, the length L and the inner diameter D of the second pipe, and the viscosity $\mu$ of the second liquid fed to the second pipe take fixed values. Accordingly, the flow rate Q in the second pipe can proportionally be controlled by only using the in-tank pressure that corresponds to the pressure gradient $\Delta P$ between both ends of the second pipe.

The Hagen-Poiseuille law is based on the assumption that the flow in a pipe is a laminar flow. The laminar flow means a regular and orderly flow. The turbulent flow means an irregular flow.

A rough distinction between the laminar flow and the turbulent flow is generally determined based on Reynolds number Re. The laminar flow is considered to be in the range of Re≤2300. The turbulent flow is considered to be in the range of Re>2300. The Reynolds number Re is a non-dimensional number defined by the ratio between inertia force and viscous force that act on a fluid.

Here, Reynolds number Re [-] is defined by:

$$Re = u \times D / v$$

where v[m$^2$/s] represents the coefficient of kinematic viscosity, u[m/s] represents the mean velocity in a pipe, and D[m] represents the inner diameter of the pipe. According to the expression, the Reynolds number Re becomes larger with increasing the mean velocity in the pipe u[m/s], with increasing the inner diameter D[m] of the pipe, and with decreasing the coefficient of kinematic viscosity v[m$^2$/s]. In that case, the flow in the pipe is more likely to be turbulent.

When the flow in the pipe becomes turbulent, the aforementioned Hagen-Poiseuille law no longer holds. This makes it difficult to perform proportional control of the flow rate Q of the second liquid flowing through the second pipe based on the pressure gradient $\Delta P$ (which may also be referred to as differential pressure below) between both ends of the second pipe. Therefore, the assumption that the liquid that flows through the pipe is a laminar flow is important for controlling the flow rate of the said liquid. This is particularly important for carrying out precise control to adjust the component concentration of the diluted solution to a specified value even when the flow rate of the diluted solution fluctuates. Therefore, in implementation of the present invention, it is preferable that the liquid that flows through the second pipe be laminar.

In the present invention, in order to perform more precise control of the component concentration of the diluted solution to be produced, the second pipe that supplies the second liquid (chemical liquid to be diluted) preferably has an inner diameter of more than 0.1 mm and 4 mm or less.

The reason thereof will be described below. The mean velocity u[m/s] in the pipe can be defined by the expression $u=4\times Q/(\pi \times D^2)$ where $Q[m^3/s]$ is the flow rate and D[m] is the diameter. Therefore, the aforementioned expression of the Reynolds number Re[–] can also be expressed by another expression $Re=4\times Q/(\pi \times D\times v)$, where $Q[m^3/s]$ is the flow rate, D[m] is the diameter, and $v[m^2/s]$ is the coefficient of kinematic viscosity.

Here, in order to make the second liquid that flows through the second pipe flow at a certain flow rate Q in a laminar flow state, only the inner diameter D of the second pipe can be set accordingly since the coefficient of kinematic viscosity v is determined by the flowing liquid and the pipe friction. In this case, as is clear from the above-stated another expression, if the flow rate is unchanged, the flow in the pipe is more likely to be laminar when the inner diameter D of the second pipe becomes larger. However, if the inner diameter D of the second pipe is made larger, the pressure gradient ΔP between both ends of the second pipe becomes smaller as indicated by the Hagen-Poiseuille law. When the pressure gradient ΔP is too small, flow adjustment in the second pipe becomes easily influenced by a slight setting error of the in-tank pressure or by the fluctuation in the pressure in the pipe. This may lead to a situation where it is substantially impossible to adjust the flow rate in the second pipe to a specified value.

As is clear from the above description, in the diluted solution production apparatus of the present invention, when the inner diameter of the second pipe is set in a fixed range, the second liquid that flows through the second pipe is likely to in a laminar flow state, and it is easy to proportionally control the flow rate of the second liquid.

In examples as shown in Table 1, when the inner diameter D of the second pipe is more than 4 mm, the flow is more likely to be turbulent as the flow rate Q in the second pipe becomes larger, and the pressure gradient ΔP becomes too small as the flow rate Q in the second pipe becomes smaller. Accordingly, it may be difficult to control the amount of the liquid added from the second pipe. In the case where the inner diameter D of the second pipe is 0.1 mm or less, the inner diameter of the pipe is too small so that the pressure gradient ΔP becomes too large. As a result, it may be difficult to control the amount of the liquid added from the second pipe in practice. Therefore, when the inner diameter of the second pipe is in the range of more than 0.1 mm and 4 mm or less, the diluted solution can be provided with an accurate component concentration as specified.

Advantageous Effects of Invention

According to the present invention, by appropriately controlling the pressure in a tank, which stores a high concentration liquid to be diluted, based on the measured values of the flow rate and the component concentration of a diluted solution to be produced, a high concentration liquid can be precisely added to a diluent medium so as to produce the diluted solution at a specified component concentration. In addition, according to the present invention, a simple apparatus structure is ensured.

DESCRIPTION OF EMBODIMENTS

Hereinafter, some embodiments of the present invention will be described with reference to the drawings.

First Embodiment

Figure 1:
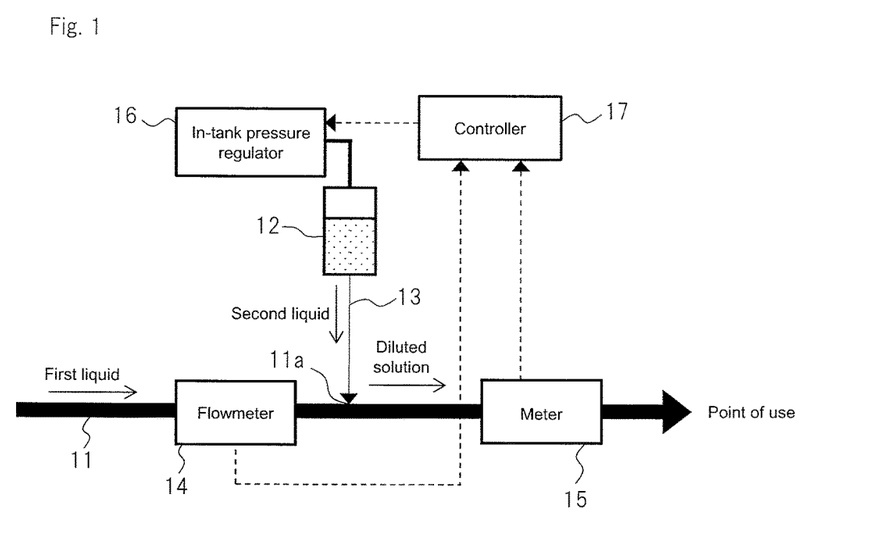
FIG. 1 is a concept view showing a diluted solution production apparatus of a first embodiment of the present invention.

FIG. 1 conceptually shows a diluted solution production apparatus of a first embodiment of the present invention. Although not shown in FIG. 1, components such as filters and valves may be installed in a piping system in the drawing.

The diluted solution production apparatus of the first embodiment includes first pipe 11 that supplies a first liquid to a point of use, tank 12 that stores a second liquid, and second pipe 13 that supplies the second liquid from tank 12 to first pipe 11. The second liquid is a chemical liquid to be diluted. The first liquid is a diluent medium, such as pure water that dilutes the second liquid. Therefore, the liquid obtained by supplying the second liquid to the first liquid is a diluted solution of the second liquid.

First pipe 11 includes connection 11a, to which second pipe 13 is connected, in a middle thereof. On the upstream side of connection 11a in first pipe 11, flowmeter 14 is installed to measure the flow rate of the first liquid flowing through first pipe 11. On the downstream side of connection 11a in first pipe 11, meter 15 is installed to measure the component concentration of the diluted solution.

A method of connecting second pipe 13 to connection 11a of first pipe 11 is not particularly limited as long as the first liquid and the second liquid are appropriately mixed. For example, it is preferable to connect first pipe 11 and second pipe 13 such that the front end of second pipe 13 is positioned in the central portion of first pipe 11 because the first liquid and the second liquid are efficiently mixed.

In-tank pressure regulator 16 that adjusts the in-tank pressure to a specified value is connected to tank 12. The diluted solution production apparatus of the first embodiment further includes controller 17. Controller 17 calculates the target value of the in-tank pressure that causes the component concentration of the diluted solution to be a specified value based on the measured values of flowmeter 14 and meter 15. Controller 17 then controls in-tank pressure regulator 16 so as to adjust the in-tank pressure to the target value.

While in-tank pressure regulator 16 may have any configuration as long as the pressure can immediately be adjusted under a command of controller 17, it is preferable that in-tank pressure regulator 16 comprise a gas supplier that supplies inactive gas to an upper side in tank 12 and a regulator that adjusts supply pressure of the inactive gas. While the type of the inactive gas is not particularly limited, nitrogen gas is preferable since it can be used relatively easily. Measurement with flowmeter 14 and meter 15 may be performed continuously or periodically.

Controller 17 calculates an appropriate level of the amount of the second liquid to be supplied with respect to the flow rate of the first liquid measured with flowmeter 14, in order to adjust the component concentration of the diluted solution that is to be produced to a specified value. Next, controller 17 calculates the target value of the pressure in tank 12 that corresponds to the calculated supply amount. In this case, according to the Hagen-Poiseuille law, the relation in which the flow rate Q of the second liquid flowing through second pipe 13 is proportional to the pressure gradient $\Delta P$ between both ends of the second pipe 13 is established. Therefore, the pressure in tank 12 may be changed so that the pressure gradient $\Delta P$ changes in proportion to the flow rate of the first liquid with a certain proportionality constant. For example, when the flow rate of the first liquid doubles, the pressure gradient $\Delta P$ may also be doubled. When the flow rate of the first liquid becomes half, the pressure gradient $\Delta P$ may also be halved. By performing such a control method, the proportional relation between the flow rate of the first liquid and the flow rate of the second liquid is maintained accordingly, and the diluted solution that has a stable concentration can be provided. However, the component concentration, etc. of the second liquid is not necessarily constant due to processes such as vaporization and degradation of the second liquid in the tank. Therefore, even when, for example, the component concentration of the diluted solution is a specified value at the beginning, the component concentration may gradually deviate from the specified value. Accordingly, the diluted solution production apparatus of the first embodiment has a feedback function including: measuring the component concentration of the diluted solution with meter 15; and correcting, if the measured component concentration of the diluted solution deviates from the specified value, a proportionality constant so that the component concentration of the diluted solution is adjusted to the specified value. The feedback function makes it possible to change the proportionality constant to an optimum value without it being necessary to manually calculate the proportionality constant at the time of initial startup of the apparatus or at the time of changing the target value of the component concentration of the diluted solution.

Furthermore, in order to maintain a sufficient proportional relation between the flow rate Q and the pressure gradient $\Delta P$, it is preferable that the second liquid that flows through second pipe 13 be in a laminar flow state as described in [Solution to Problem]. The inner diameter of second pipe 13 is preferably in the range of more than 0.1 mm and 4 mm or less, more preferably in the range of more than 0.1 mm and 1 mm or less.

Second pipe 13 may be made of any material. However, in the case of producing a diluted solution for cleaning electronic materials, second pipe 13 may preferably be made of materials including fluororesin such as PFA, polyethylene-based resin, and polypropylene-based resin. Among these materials, a tube made of fluororesin is particularly preferable since it elutes less.

While the length of second pipe 13 is not particularly limited, the length is preferably in the range of 0.01 m or more and 100 m or less, and more preferably in the range of 0.1 m or more and 10 m or less. It is not preferable that second pipe 13 has a length of 0.01 m or less, because the length is too short to influence the flow rate in the pipe. That is, if second pipe 13 that has a length of 0.01 m or less is used, it becomes difficult to use the pressure gradient $\Delta P$ between both ends of the second pipe 13 for proportional control of the flow rate Q of the second liquid supplied to first pipe 11. It is not preferable that the second pipe 13 has a length of 100 m or more, since not only installation of the pipe becomes difficult, but also the area of the pipe in contact with the liquid increases, which causes increased contamination of the liquid in the pipe.

The number of second pipes 13 to be installed is not particularly limited. In order to drastically change the dilution ratio, second pipe 13 that has an optimal inner diameter and length may be used as needed, depending on an installation condition of the diluted solution production apparatus. The amount of the second liquid that is supplied is preferably in the range of 10 µL/min or more and 500 mL/min or less. In this range, it becomes possible to accurately control the amount of the second liquid that is supplied by using a pipe having an inner diameter of more than 0.1 mm and 4 mm or less.

The type of the first liquid is not particularly limited. Ultrapure water, pure water, water containing dissolved electrolyte or gas, and alcohols such as an isopropyl alcohol may be used according to usage application. The type of the second liquid is not particularly limited as long as the second liquid is used in a diluted state. Water containing dissolved electrolyte or gas, and alcohols such as an isopropyl alcohol may be used according to usage application.

In the case where a diluted solution produced with the diluted solution production apparatus of the present invention is used for cleaning electronic materials, ultrapure water may be used as the first liquid, and an aqueous solution containing dissolved electrolyte may be used as the second liquid. The type of the aqueous solution containing dissolved electrolyte is not particularly limited. Examples of the aqueous solution containing dissolved electrolyte include aqueous solutions of acid such as hydrochloric acid, sulfuric acid, hydrofluoric acid, nitric acid, and carbonic acid, and aqueous solutions of alkalis such as ammonia, potassium hydroxide, and sodium hydroxide. This is because, in recent years, attention has been paid to the discovery that the cleaning water, obtained by adding a slight amount of gas constituents or chemicals to ultrapure water, has effects such as removing impurities on the surface of semiconductor wafers and preventing electrification, the gas constituents including hydrogen, oxygen and ozone, the chemicals including hydrochloric acid, hydrofluoric acid, carbonic acid, and aqueous ammonia.

For example, using dilute aqueous ammonia for cleaning wafers is known to be effective for preventing electrification during the wafer cleaning process, the dilute aqueous ammonia being obtained by diluting high concentration aqueous ammonia containing 29 wt % ammonia hundreds of thousands of times with water. In the case where a pump is used for diluting the high concentration aqueous ammonia (for adding the high concentration aqueous ammonia to ultrapure water) as disclosed in Patent Literature 1, it is necessary to preliminarily dilute the high concentration aqueous ammonia to some extent and then add the diluted aqueous ammonia with the pump since a high dilution ratio is involved. On the other hand, in the diluted solution production apparatus of the present invention, the amount of high concentration aqueous ammonia that is supplied to ultrapure water can be precisely controlled. This makes it possible skip the preliminary process of diluting the high concentration aqueous ammonia to some extent.

Flowmeter 14 that measures the flow rate of the diluted solution produced in the diluted solution production apparatus of the present invention or the first liquid may have any configuration as long as flowmeter 14 has a function of transmitting a measured value to controller 17. Examples of flowmeter 14 include a Kalman vortex flowmeter and an ultrasonic flowmeter. Meter 15 may have any configuration as long as meter 15 has functions of measuring the component concentration of the diluted solution as an electrochemical constant, and transmitting the measured value. Examples of meter 15 include an electric conductivity meter, a pH meter, a resistivity meter, an oxidation-reduction potentiometer (ORP meter), and an ion electrode meter.

The installation position of flowmeter 14 is not particularly limited as long as fluctuation in the flow rate inside first pipe 11 that supplies the diluted solution to a point of use can be monitored. As shown in FIG. 1, flowmeter 14 may be installed on the upstream side of connection 11a in first pipe 11 to measure the flow rate of the first liquid in first pipe 11. Alternatively, flowmeter 14 may be installed on the downstream side of connection 11a in first pipe 11 to measure the flow rate of the diluted solution that flows through first pipe 11. This is because the amount of the second liquid that is supplied is far smaller than the flow rate of the first liquid, and therefore the flow rate of the first liquid can be treated as an equivalent of the flow rate of the diluted solution.

The installation position of meter 15 is on the downstream side of connection 11a in first pipe 11 as shown in FIG. 1. In this installation position, meter 15 may directly be installed in first pipe 15, or meter 15 may be installed in a bypass line provided so as to branch from first pipe 15 and to again be joined to the first pipe 15.

Second Embodiment

Figure 2:
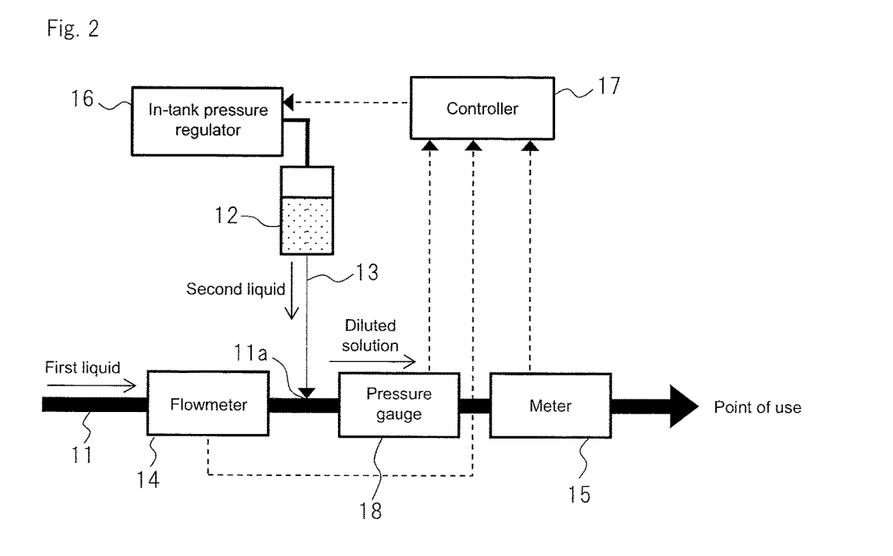
FIG. 2 is a concept view showing the diluted solution production apparatus of a second embodiment of the present invention.

FIG. 2 conceptually shows the diluted solution production apparatus of a second embodiment of the present invention. Here, components similar to those in the first embodiment are designated by similar reference signs, and differences from the first embodiment will be described mainly.

As shown in FIG. 2, the diluted solution production apparatus of the second embodiment includes, in addition to the components of the first embodiment, pressure gauge 18 that can measure in-pipe pressure at connection 11a where second pipe 13 connects to first pipe 11. Furthermore, controller 17 of this embodiment calculates the target value of the pressure in tank 12 that causes the component concentration of the diluted solution to be a specified value based on the measured values of flowmeter 14, meter 15, and pressure gauge 18. Controller 17 then controls in-tank pressure regulator 16 so as to adjust the pressure in tank 12 to the target value.

As is understood from the Hagen-Poiseuille law, the pressure gradient $\Delta P$ between both ends of the second pipe 13 influences the accuracy of the amount of the second liquid to be supplied. Accordingly, when the pressure at connection 11a drastically fluctuates, it becomes difficult to stably produce the diluted solution having a specified component concentration. In the case of the second embodiment, the pressure fluctuation in connection 11a can be monitored, so that the amount of the second liquid to be supplied can be controlled more accurately, and the diluted solution with a specified component concentration can be stably provided.

Pressure gauge 18 may have any configuration as long as it has a function of transmitting the measured value to controller 17. In FIG. 2, the installation position of pressure gauge 18 is on the downstream side of connection 11a in first pipe 11. However, the installation position may be on the upstream side of connection 11a in first pipe 11 as long as the in-pipe pressure at connection 11a can be measured. Therefore, "the in-pipe pressure at connection 11a" as used herein refers to the in-pipe pressure not only in the just position where second pipe 13 connects to first pipe 11 but also in the vicinity of the just position. The phrase "the vicinity of connection 11a" is used to refer, for example, to a region within the ranges of 1 m forward and backward connection 11a of first pipe 11.

Third Embodiment

Figure 3:
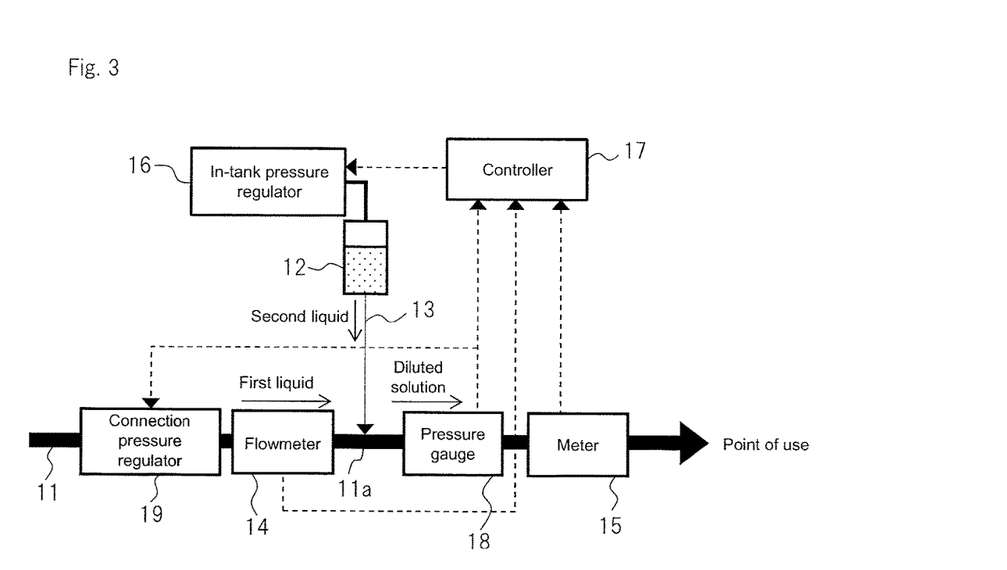
FIG. 3 is a concept view showing the diluted solution production apparatus of a third embodiment of the present invention.

FIG. 3 conceptually shows the diluted solution production apparatus of a third embodiment of the present invention. Here, components similar to those in the first and second embodiments are designated by similar reference signs, and differences from the first and second embodiments will be described mainly.

As shown in FIG. 3, the diluted solution production apparatus of the third embodiment includes, in addition to the components of the first and second embodiments, connection pressure regulator 19 that adjusts the in-pipe pressure at connection 11a to a specified value based on the measured value of the pressure gauge 18. Furthermore, controller 17 of this embodiment calculates the target value of the pressure in tank 12 that causes the component concentration of the diluted solution to be a specified value based on the measured values of flowmeter 14, meter 15, and pressure gauge 18. Controller 17 then controls in-tank pressure regulator 16 so as to adjust the pressure in tank 12 to the target value. Since the connection pressure regulator 19 adjusts the in-pipe pressure at connection 11a to a specified value, controller 17 may calculate the target value of the pressure in tank 12 based on the measured values of flowmeter 14 and meter 15.

As connection pressure regulator 19, any method may be adopted, such as a method of installing a pump on the upstream side of connection 11a in first pipe 11 and controlling the number of rotations of the pump so as to adjust the in-pipe pressure at connection 11a to a specified value. Alternatively, a method of installing an opening adjustment valve may be adopted as connection pressure regulator 19, in which the opening adjustment valve is installed on the upstream or downstream side of connection 11a in first pipe 11 and the opening of the valve is controlled so as to adjust the in-pipe pressure at connection 11a to a specified value. The method of using the pump is particularly preferable since the in-pipe pressure at connection 11a can easily be controlled. The type of the pump to be used is not particularly limited. Examples of the pump include a bellows-type pump and a magnetic levitation-type pump.

EXAMPLES

The present invention will now be concretely described based on examples. The description is illustrative only and is not intended to limit the present invention. Here, cases of producing, as a diluted solution, dilute aqueous ammonia usable for cleaning electronic materials will be described as the examples.

First Example

Figure 4:
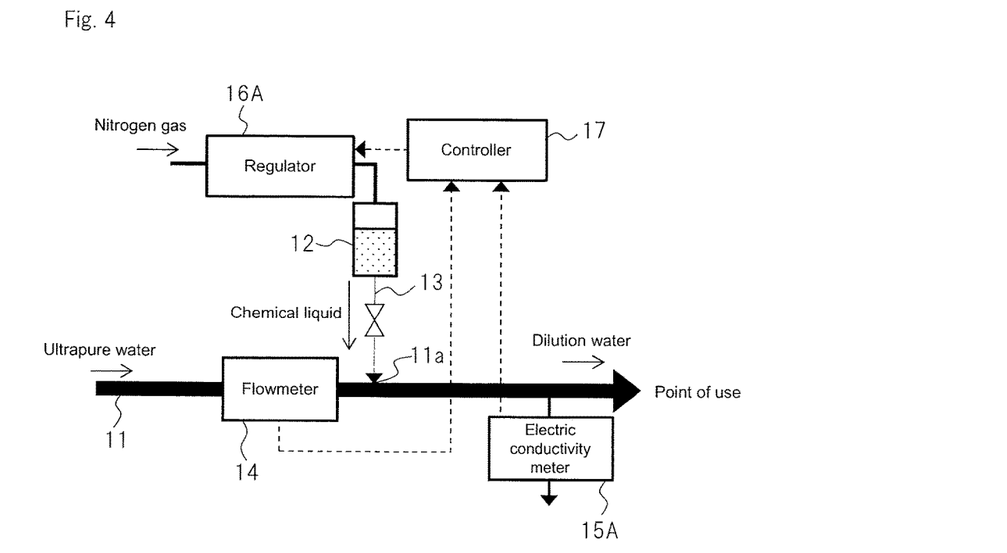
FIG. 4 is a concept view showing a diluted solution production apparatus of a first example of the present invention.

FIG. 4 shows a concept view of a dilute aqueous ammonia production apparatus of a first example.

First, ultrapure water was fed to first pipe 11 made of PFA. The ultrapure water had an electrical resistivity of 18 MΩ·cm or more, and a total organic carbon (TOC) of 1.0 ppb or less. Next, high concentration aqueous ammonia containing 29 wt % ammonia (for electronic industry, made by Kanto Chemical Co., Inc.) was supplied as a chemical liquid from tank 12 made of PFA to the ultrapure water in first pipe 11 through second pipe 13. As a consequence, dilute aqueous ammonia having a specified component concentration was produced and supplied to a point of use. As second pipe 13, a pipe made of PFA with an inner diameter of 0.3 mm and a length of 1 m was used.

By measuring the electric conductivity of the dilute aqueous ammonia to monitor the component concentration (ammonia concentration) thereof, dilute aqueous ammonia was produced so as to have an electric conductivity of 20 μS/cm (target value). Specifically, the electric conductivity of the dilute aqueous ammonia was measured with electric conductivity meter 15A. The flow rate of the ultrapure water that flows through first pipe 11 was measured with flowmeter 14. Based on the respective measured values, the target value of the pressure in tank 12 was calculated. The target value at that time was a value that could cause the component concentration of the diluted solution to be a specified value in accordance with the amount of the high concentration aqueous ammonia supplied from tank 12 to first pipe 11. Controller 17 then controlled regulator (EVD-1500 made by CKD Corporation) 16A for controlling nitrogen gas supplied from a nitrogen gas supply source (not shown) to tank 12, so as to adjust the pressure in tank 12 to coincide with the target value. As flowmeter 14, an ultrasonic flowmeter (UCUF-20K made by Tokyo Keiso Co., Ltd.) was used. As electric conductivity meter 15A, an electric conductivity meter (M300 made by Mettler-Toledo International Inc.) was used.

The control as described above was performed to adjust the electric conductivity of the dilute aqueous ammonia to be produced to 20 μS/cm. This is because the dilute aqueous ammonia for practical use as a cleaning liquid for electronic industry is required to have an electric conductivity of 5 to 40 μS/cm.

Figure 5:
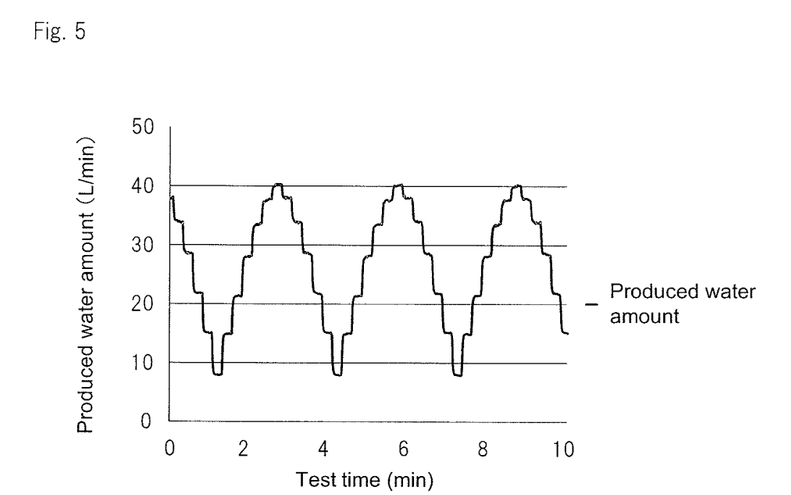
FIG. 5 is a graph showing fluctuation in water consumption in a point of use in the first example.

As shown in FIG. 5, when a produced water amount (water consumption in the point of use) was changed in a stepwise manner, the electric conductivity of the obtained dilute aqueous ammonia fluctuated between 18.3 and 21.9 μS/cm with respect to the target value of 20 μS/cm. That is, even when the produced water amount was changed, the supply amount of the high concentration aqueous ammonia immediately followed the change so as to adjust the electric conductivity of the dilute aqueous ammonia being produced to a specified value. As a result, the dilute aqueous ammonia could be produced with stable conductivity. In the test, according to the calculation, the flow rate in second pipe 13 fluctuated between 0.122 and 0.974 mL/min, and the Reynolds number Re at that time was thought to be 6 to 48. That is, it is thought that the flow in the second pipe 13 was a laminar flow.

Second Example

Figure 6:
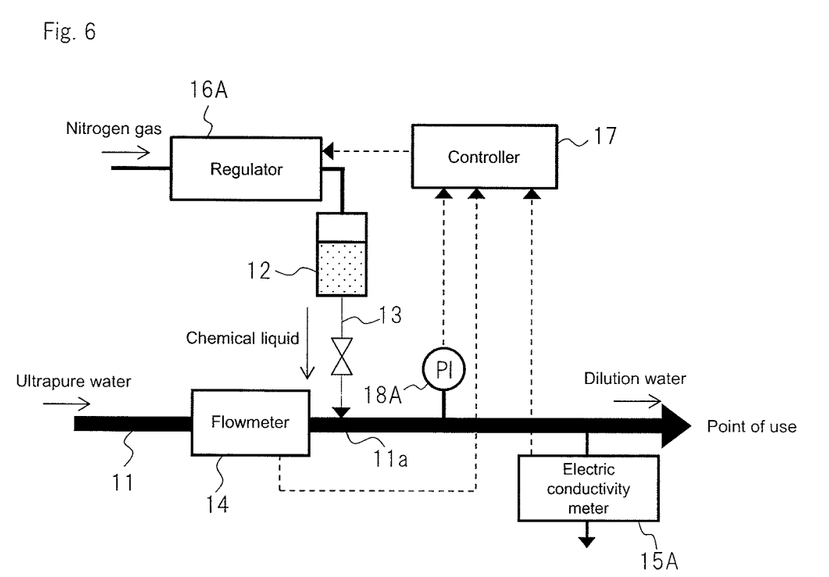
FIG. 6 is a concept view showing the diluted solution production apparatus of a second example of the present invention.

FIG. 6 shows a concept view of a dilute aqueous ammonia production apparatus of a second example.

In the second example, pressure gauge (HPS made by Surpass Industry Co., Ltd.) 18A that can measure the pressure of connection 11a between first pipe 11 and second pipe 13 was added to the apparatus of the first example (FIG. 4). A target value of the pressure in tank 12 was calculated based on the measured values of flowmeter 14, electric conductivity meter 15A, and pressure gauge 18A. Other configurational aspects were the same as those of the first example.

When the produced water amount (water consumption in a point of use) was changed in a stepwise manner as in the first example, the electric conductivity of the obtained dilute aqueous ammonia fluctuated between 18.9 and 21.2 μS/cm with respect to a target value of 20 μS/cm. In the second example, the dilute aqueous ammonia could be produced with more stable conductivity than that of the first example.

Third Embodiment

Figure 7:
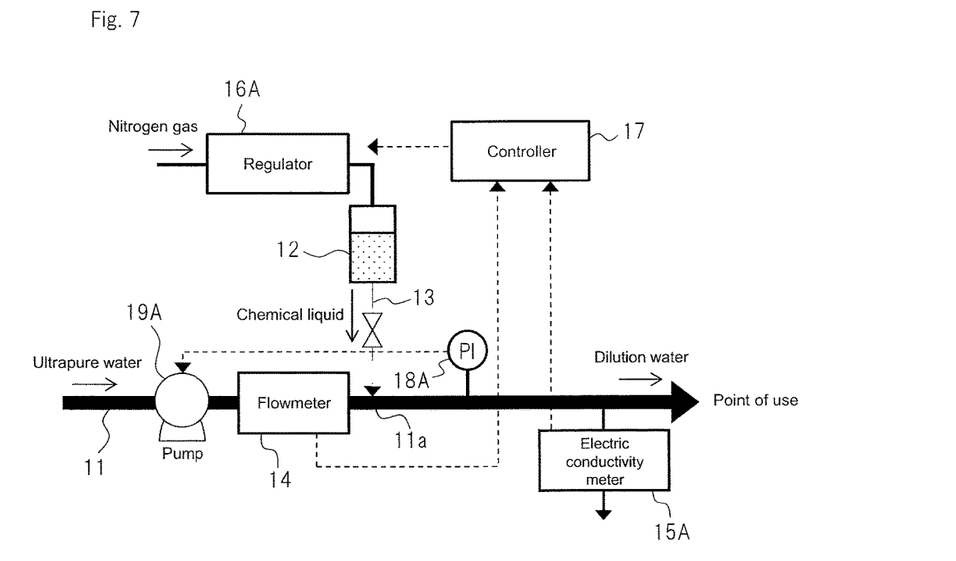
FIG. 7 is a concept view showing the diluted solution production apparatus of a third example of the present invention.

FIG. 7 shows a concept view of a dilute aqueous ammonia production apparatus of a third example.

In the third example, pressure gauge (HPS made by Surpass Industry Co., Ltd.) 18A that can measure the pressure of connection 11a between first pipe 11 and second pipe 13, and magnetic levitation-type supply pump (BPS-4 made by Levitronix Japan K.K.) 19A that uses to adjust the pressure of connection 11a to a specified value based on the measured value of pressure gauge 18A were added to the apparatus (FIG. 4) of the first example. The number of rotations of pump 19A was controlled so as to adjust the measured value of pressure gauge 18A to 280 kPa, and a target value of the pressure in tank 12 was calculated based on the measured values of flowmeter 14 and electric conductivity meter 15A. Other configurational aspects were the same as those of the first example.

When the water consumption in the point of use was changed in a stepwise manner as in the first example, the electric conductivity of the obtained dilute aqueous ammonia fluctuated between 19.3 and 20.5 μS/cm with respect to the target value of 20 μS/cm. In the third example, the dilute aqueous ammonia could be produced with electric conductivity more stable than that in the second example.

Fourth Example

In a fourth example, dilute aqueous ammonia was produced so as to have an electric conductivity of 5 μS/cm (target value) using a pipe made of PFA as second pipe 13, the pipe having an inner diameter of 0.2 mm and a length of 3 m. Other configurational aspects were the same as those of the third example.

When the produced water amount (water consumption in a point of use) was changed in a stepwise manner as in the first example, the electric conductivity of the obtained dilute aqueous ammonia fluctuated between 4.7 and 5.2 μS/cm with respect to a target value of 5 μS/cm. In the test, according to the calculation, the flow rate in second pipe 13 fluctuated between 0.012 and 0.098 mL/min, and the Reynolds number Re at that time was thought to be 1 to 7. That is, it is thought that the flow in second pipe 13 was a laminar flow.

First Comparative Example

Figure 8:
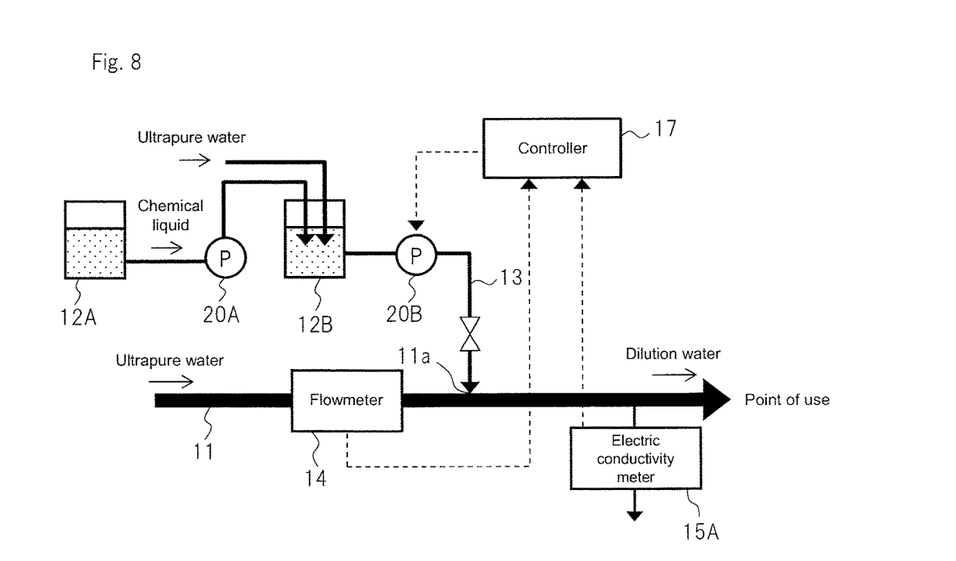
FIG. 8 is a concept view showing the diluted solution production apparatus of a first comparative example.

FIG. 8 shows a concept view of the dilute aqueous ammonia production apparatus of a first comparative example.

In the first to third examples, a pressure gradient between the tank that stores high concentration aqueous ammonia and the pipe that carries ultrapure water was taken advantage of to supply high concentration aqueous ammonia to the ultrapure water. In the first comparative example, a pump was used for supplying high concentration aqueous ammonia to ultrapure water.

In the first comparative example, high concentration aqueous ammonia containing 29 wt % ammonia was stored in primary tank 12A made of PFA, and the high concentration aqueous ammonia was supplied to secondary tank 12B with primary pump 20A and then was diluted 200 times with ultrapure water. The diluted aqueous ammonia was supplied to the ultrapure water in first pipe 11 with secondary pump 20B. As pumps 20A and 20B, a chemical injection pump (DDA made by Grundfos Pumps K.K.) was used.

For the amount supplied by secondary pump 20B, a target value of the discharge pressure of secondary pump 20B was calculated based on the measured values of flowmeter 14 and electric conductivity meter 15A. The target value at that time was a value that could cause the component concentration of the diluted solution to be a specified value in accordance with the amount of the high concentration aqueous ammonia supplied from tank 12B to first pipe 11. The configurational aspects, other than the aspect of using the pump to supply the high concentration aqueous ammonia to the ultrapure water in first pipe 11, were the same as those of the first example.

When the water consumption in the point of use was changed in a stepwise manner as in the first example, the electric conductivity of the obtained dilute aqueous ammonia fluctuated between 17.3 and 22.6 μS/cm with respect to the target value of 20 μS/cm.

Second Comparative Example

Figure 9:
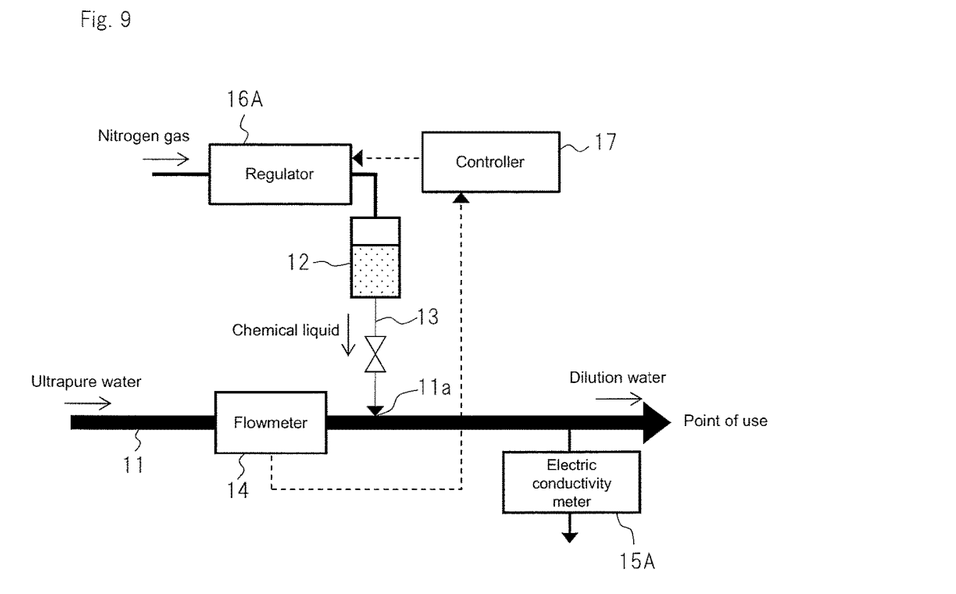
FIG. 9 is a concept view showing the diluted solution production apparatus of a second comparative example.

FIG. 9 shows a concept view of a dilute aqueous ammonia production apparatus of a second comparative example.

In the first to third examples, the target value of the in-tank pressure was calculated based on the measured values of flowmeter 14 and electric conductivity meter 15A. However, in the second comparative example, the target value of the in-tank pressure was calculated based only on the measured value of flowmeter 14. Other configurational aspects were the same as those of the first example.

When the water consumption in the point of use was changed in a stepwise manner as in the first example, the electric conductivity of the obtained dilute aqueous ammonia fluctuated between 17.3 and 21.6 μS/cm with respect to the target value of 20 μS/cm. As compared with the first example, the control range of the electric conductivity was widened, and the electric conductivity, in particular, often became less than the target value of 20 μS/cm. This was thought to be because the high concentration aqueous ammonia in tank 12 vaporized in gaseous phase during the production process of the dilute aqueous ammonia, which causes the ammonia concentration in tank 12 to become lower than the original specified concentration.

Fifth Example

The following experiment was carried out to determine the range of the inner diameter of the pipe (second pipe 13), which is used for adding a minute amount of a chemical liquid to ultrapure water, in order to allow precise control of the amount of the chemical liquid to be added. More specifically, three types of pipes identical in length and different in inner diameter were prepared to measure a differential pressure (i.e., a pressure gradient between both ends of each pipe) when ultrapure water was fed to the three pipe. Then, the range in which the flow rate and the differential pressure had proportional relation was determined. The prepared three types of pipes were 2 m in length and were $\phi 2.5$ mm, $\phi 4$ mm, and $\phi 6$ mm in inner diameter, respectively.

The Reynolds numbers were also calculated based on the flow rate [L/h] when ultrapure water was fed to the pipes and based on the inner diameters of the pipes [mm]. For calculation, the expression based on the aforementioned Hagen-Poiseuille law was used: Re=4×Q/π×D×ν). The coefficient of kinematic viscosity ν was defined as the coefficient of kinematic viscosity of pure water under atmospheric pressure at 20° C. ($1.004 \times 10^{-6}$ (m$^2$/s)).

Figure 10:
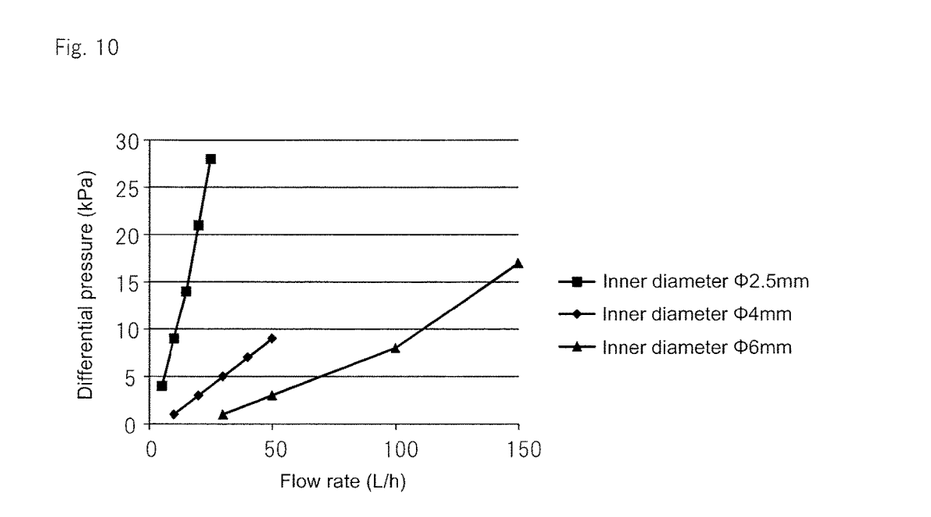
FIG. 10 is a graph showing the result of examining the relation between the flow rate and the differential pressure between both ends of a pipe when water is fed to the pipe whose inner diameter varies.
Figure 11:
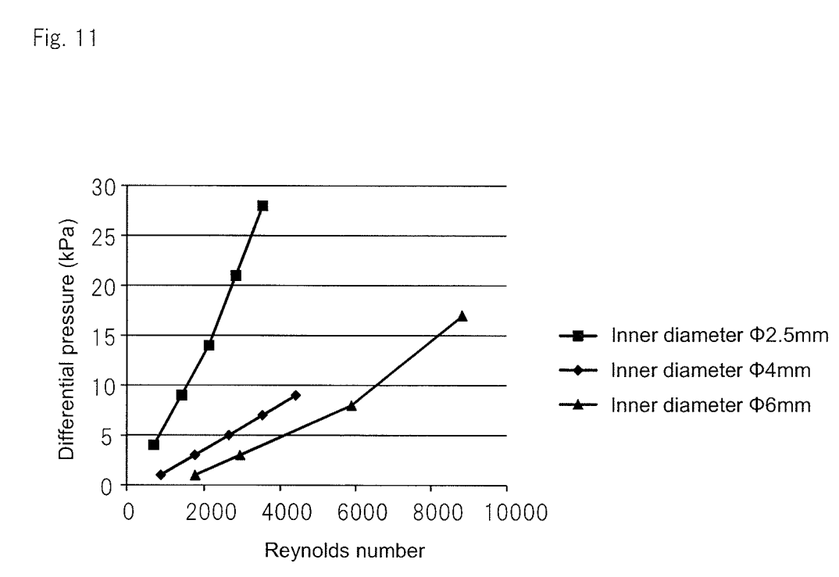
FIG. 11 is a graph showing the result of examining a relation between the Reynolds number and the differential pressure between both ends of the pipe when water is fed to the pipe whose inner diameter varies.

The result of the above experiment is shown in Table 1 below. FIGS. 10 and 11 are graphs showing, based on the data of Table 1, the relation between the flow rate and the differential pressure for each of the pipes having different inner diameters and the relation between the Reynolds number and the differential pressure for each of the pipes having different inner diameters, respectively.

As shown in Table 1, when the flow rate of the water, which passed through the pipe having an inner diameter of $\phi 2.5$ mm, was changed to 5 L/h, 10 L/h, 15 L/h, 20 L/h, and 25 L/h, differential pressures in the respective flow rates were 4 kPa, 9 kPa, 14 kPa, 21 kPa, and 28 kPa. When the flow rate exceeded 20 L/h, the inclination of a straight line in the graph of FIG. 10 slightly increased, and the proportional relation between the flow rate and the differential pressure no longer held.

When the flow rate of the water, which passed through the pipe having an inner diameter of $\phi 4$ mm, was changed to 10 L/h, 20 L/h, 30 L/h, 40 L/h, and 50 L/h, differential pressures in the respective flow rates were 1 kPa, 3 kPa, 5 kPa, 7 kPa, and 9 kPa. When the flow rate exceeded 30 L/h, the inclination of a straight line of the graph in FIG. 10 slightly increased, and the proportional relation between the flow rate and the differential pressure no longer held. The calculated Reynolds number Re also exceeded 2300, which indicates that the flow in the pipe was a turbulent flow.

When the flow rate of the water, which passed through the pipe having an inner diameter of $\phi 6$ mm, was changed to 30 L/h, 50 L/h, 100 L/h, and 150 L/, differential pressures in the respective flow rates were 1 kPa, 3 kPa, 8 kPa, and 17 kPa. When the flow rate exceeded 50 L/h, the inclination of a straight line of the graph in FIG. 10 slightly increased, and the proportional relation between the flow rate and the differential pressure no longer held. The calculated Reynolds number Re also exceeded 2300, which indicates that the flow in the pipe was a turbulent flow.

Table 1 also shows the flow rate, the differential pressure in the flow rate, and the Reynolds number when the water was fed to pipes having inner diameters of $\phi 0.1$ mm and $\phi 0.2$ mm. It should be noted that data about the pipes having inner diameters of φ0.1 mm and φ0.2 mm were obtained not by experiment but by calculation since the diameters of the pipes were too small. When the flow rate of the water, which passed through the pipe having an inner diameter of φ0.1 mm, was changed to 0.001 L/h, 0.005 L/h, and 0.01 L/h, calculated differential pressures in the flow rates were 227 kPa, 1127 kPa, and 2268 kPa, respectively. Therefore, for practical use of such a pipe to add the chemical liquid, a large differential pressure is needed. When comparing this result with data about the pipe having an inner diameter of φ0.2 mm as shown in Table 1, it was found out that the pipe having an inner diameter of φ0.1 mm needed a considerably larger differential pressure at the same flow rate.

The above results indicate that the inclination of the graphs in FIGS. 10 and 11 substantially decreases when the inner diameter of the pipe is larger than φ4 mm. That is, when the inner diameter of the pipe is larger than φ4 mm, it may be difficult to control the amount of the chemical liquid to be added because a turbulent flow becomes more dominant when the flow rate in the pipe becomes larger and because the differential pressure becomes too small when the flow rate in the pipe becomes smaller. On the other hand, when the inner diameter of the pipe is smaller than φ2.5 mm, it is thought that the inclination of the graphs in FIGS. 10 and 11 substantially increases. It may also become particularly difficult to control the amount of the chemical liquid to be added when, in particular, the differential pressure becomes too large due to the inner diameter of the pipe being too small, such as the pipe having an inner diameter of φ0.1 mm shown in Table 1.

TABLE 1

| Inner diameter of pipe φ [mm] | Length [m] | Flow rate [L/h] | Differential pressure [kPa] | Reynolds number |
|---|---|---|---|---|
| 0.1 | 2 | 0.001 | 227 | 4 |
|  |  | 0.005 | 1127 | 18 |
|  |  | 0.01 | 2268 | 35 |
| 0.2 |  | 0.001 | 14 | 2 |
|  |  | 0.005 | 70 | 9 |
|  |  | 0.01 | 142 | 18 |
| 2.5 |  | 5 | 4 | 705 |
|  |  | 10 | 9 | 1418 |
|  |  | 15 | 14 | 2122 |
|  |  | 20 | 21 | (2827) |
|  |  | 25 | 28 | (3531) |
| 4 |  | 10 | 1 | 886 |
|  |  | 20 | 3 | 1767 |
|  |  | 30 | 5 | (2653) |
|  |  | 40 | 7 | (3533) |
|  |  | 50 | 9 | (4419) |
| 6 |  | 30 | 1 | 1768 |
|  |  | 50 | 3 | (2946) |
|  |  | 100 | 8 | (5896) |
|  |  | 150 | 17 | (8842) |

* In the table, numerical values in parentheses represent the Reynolds numbers included in a turbulent flow range.

REFERENCE SIGNS LIST

11 First pipe
11a Connection
12 Tank
12A Primary tank
12B Secondary tank
13 Second pipe
14 Flowmeter
15 Meter
15A Electric conductivity meter
16 In-tank pressure regulator
16A Regulator
17 Controller
18 18A Pressure gauge
19 Connection pressure regulator
19A Metering pump
20A, 20B Chemical injection pump

The invention claimed is:

1. A diluted solution production method of producing a diluted solution of a second liquid by adding the second liquid to a first liquid, the method comprising:
   feeding the first liquid to a first pipe; and
   controlling pressure in a tank that stores the second liquid so as to add, through a second pipe that connects the tank to the first pipe, the second liquid to the first liquid flowing through the first pipe,
   adding the second liquid including:
   measuring a flow rate of the first liquid or the diluted solution that flows through the first pipe;
   measuring a component concentration of the diluted solution;
   measuring pressure in the first pipe;
   controlling pressure in the tank, based on measured values of the flow rate, component concentration, and the pressure in the first pipe, so as to adjust the component concentration of the diluted solution to a specified value.

2. The diluted solution production method according to claim 1, wherein
   adding the second liquid includes feeding the second liquid to the second pipe in a laminar flow state.

3. The diluted solution production method according to claim 1, wherein
   adding the second liquid includes feeding the second liquid to the second pipe having an inner diameter in a range of more than 0.1 mm and 4 mm or less.

4. The diluted solution production method according to claim 1, wherein
   measuring the pressure in the first pipe includes measuring an in-pipe pressure at a connection between the first pipe and the second pipe.

5. The diluted solution production method according to claim 4, wherein
   adding the second liquid further includes adjusting the in-pipe pressure at the connection to be a specified value based on the measured value of the in-pipe pressure.

6. The diluted solution production method according to claim 1, wherein
   the first liquid is ultrapure water, and the second liquid is an aqueous solution containing dissolved electrolyte.

7. The diluted solution production method according to claim 1, wherein
   the first liquid is ultrapure water, and the second liquid is an ammonia aqueous solution.

* * * * *